United States Patent
Chen et al.

(10) Patent No.: US 11,719,766 B2
(45) Date of Patent: Aug. 8, 2023

(54) MAGNETIC DISTRIBUTION DETECTION METHOD

(71) Applicant: National Cheng Kung University, Tainan (TW)

(72) Inventors: Yi-Chun Chen, Tainan (TW); Yi-De Liou, Changhua County (TW); Guo-Wei Huang, Taipei (TW)

(*) Notice: Subject to any disclaimer, the term of this patent is extended or adjusted under 35 U.S.C. 154(b) by 0 days.

(21) Appl. No.: 17/585,570

(22) Filed: Jan. 27, 2022

(65) Prior Publication Data

US 2023/0078584 A1 Mar. 16, 2023

(30) Foreign Application Priority Data

Sep. 15, 2021 (TW) ................. 110134456

(51) Int. Cl.
| | |
|---|---|
| *G01R 33/385* | (2006.01) |
| *G01R 33/038* | (2006.01) |
| *G01Q 60/08* | (2010.01) |
| *G06N 20/00* | (2019.01) |

(52) U.S. Cl.
CPC ......... *G01R 33/0385* (2013.01); *G01Q 60/08* (2013.01); *G06N 20/00* (2019.01)

(58) Field of Classification Search
CPC ................ G01R 33/00; G01R 33/0035; G01R 33/0023; G01R 33/0017; G01R 31/3191; G01R 33/0385; G01B 7/004; G01C 17/38; G06F 3/017; G06F 3/0346; G06F 3/012; G01Q 60/08; G06N 20/00
See application file for complete search history.

(56) References Cited

U.S. PATENT DOCUMENTS

| | | | | |
|---|---|---|---|---|
| 6,059,718 | A | * | 5/2000 | Taniguchi ................ A61B 5/06 600/117 |
| 6,337,477 | B1 | * | 1/2002 | Shimada ................ G01Q 60/22 977/875 |
| 9,478,393 | B2 | | 10/2016 | Potocek et al. |
| 9,535,087 | B2 | | 1/2017 | Jesse et al. |
| 9,612,257 | B1 | | 4/2017 | Jesse et al. |
| 10,295,617 | B2 | | 5/2019 | Kimura |
| 10,573,488 | B2 | | 2/2020 | Lazic et al. |
| 11,132,637 | B1 | * | 9/2021 | Hahn ...................... H04W 4/35 |

(Continued)

FOREIGN PATENT DOCUMENTS

CN 111337710 A 6/2020

OTHER PUBLICATIONS

Agar et al., "Machine Detection of Enhanced Electromechanical Energy Conversion in PbZr0.2Ti0.803 Thin Films", Advaced Materials, 2018.

(Continued)

*Primary Examiner* — Jermele M Hollington
*Assistant Examiner* — Taqi R Nasir

(57) ABSTRACT

A magnetic distribution detection method includes the steps of providing a magnetic sensor and a sample, selecting a multiple of measuring points on the sample, sensing the measuring points by the magnetic sensor, obtaining a multiple of sense data and a series of the heights of the magnetic sensor from each measuring point, using a signal decomposition algorithm to convert these sense data into data groups, and selecting one of the data groups as the magnetic distribution data of the sample.

18 Claims, 11 Drawing Sheets

(56) References Cited

U.S. PATENT DOCUMENTS

2013/0196593 A1* 8/2013 Roper .................. H04B 5/0081
455/40
2022/0003798 A1 1/2022 Sokolov et al.

OTHER PUBLICATIONS

Collins et al., "G-mode magnetic force microscopy: Separating magnetic and electrostatic interactions using big data analytics", Applied Physics Letters, May 9, 2016.

* cited by examiner

MAGNETIC DISTRIBUTION DETECTION METHOD

BACKGROUND OF THE INVENTION

Field of the Invention

The present invention relates to a magnetic distribution detection method for detecting the magnetic distribution of a sample, particularly to the magnetic distribution detection method using machine learning.

Description of Related Art

Magnetic Force Microscope (MFM) is an atomic force microscope that uses a magnetic probe to scan a magnetic sample, and the interaction between a testing probe and the surface of a magnetic sample to measure the magnetic distribution or magnetic structure of the surface of the magnetic sample. However, the conventional magnetic force microscope still has the following shortcomings.

(1) In order to avoid the influence caused by the van der Waals force of the surface of the sample, it is necessary to take two measurements. In the first measurement, the measuring distance from the sample is closer for measuring the influence caused by the van der Waals force. In the second measurement, the measuring distance from the sample is farther, primarily for detecting the magnetic force. The results of the two measurements are combined to obtain the magnetic distribution of the surface of the sample. However, the measuring distance from the surface of the sample in the first measurement is closer, so that the result of the measurement is influenced by the van der Waals force significantly, and it is not easy to know about the magnetic force distribution at a closer distance. In the second measurement, the measuring distance from the surface of the sample is farther, the obtained magnetic signal is weaker because the magnetic force is inversely proportional to the square of distance and the spatial resolution of the magnetic distribution is limited because the diverging magnetic lines of each magnetic domain are mixed together.

(2) In order to confirm the magnetic property (i.e. the North Pole or the South Pole) of each magnetic domain on the surface of the sample, it is necessary to take another measurement after changing the magnetic pole of the probe, resulting in lowering the detection efficiency.

Therefore, how to design a highly efficient and accurate magnetic distribution detection method is worth consideration for a person having ordinary skill in the art.

SUMMARY OF THE INVENTION

It is a primary objective of the present invention to provide a magnetic distribution detection method with better detection efficiency and accuracy.

The magnetic distribution detection method of the present invention is used for detecting the magnetic distribution of a sample, and the method includes the steps of (a) providing a magnetic sensor, and aligning a probe of the magnetic sensor precisely with the sample; (b) selecting a plurality of measuring points on the sample; (c) sensing the measuring points by the magnetic sensor, and obtaining a plurality of sense data; (d) converting the sense data into a plurality of data groups by a signal decomposition algorithm; and (e) selecting one of the data groups as the magnetic distribution data of the sample. In the step (c), a plurality of heights (distances) from the measuring points is sensed, and the sense datum corresponding to each height is obtained.

In some embodiment, the magnetic sensor is a magnetic force microscope.

In some embodiment, the signal decomposition algorithm is a principal component analysis algorithm.

In some embodiment, after the step (e) the method further comprises the steps of (f) selecting a measuring point in a different magnetic area on the surface of the sample and (g) analyzing the relationship between the heights above the selected measuring points and the data obtained in the step (e). In addition, the step of clustering the magnetic distribution sense data by a clustering algorithm is carried out between the step (e) and the step (f).

In some embodiment, the clustering algorithm is a k-means clustering algorithm.

In some embodiment, the height has a range of 0~50 nm or 50~250 nm.

In some embodiment, the step of clustering the magnetic distribution sense data by a clustering algorithm is carried out after the step (e).

In some embodiment, the clustering algorithm is a k-means clustering algorithm.

In some embodiment, the sense data are represented by a phase difference.

Other and further features, advantages, and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

DESCRIPTION OF THE PREFERRED EMBODIMENTS

The objectives, technical characteristics and effects of the present invention will become apparent with the detailed description of preferred embodiments accompanied with the illustration of related drawings. It is intended that the embodiments and drawings disclosed herein are to be considered illustrative rather than restrictive.

Figure 1A:
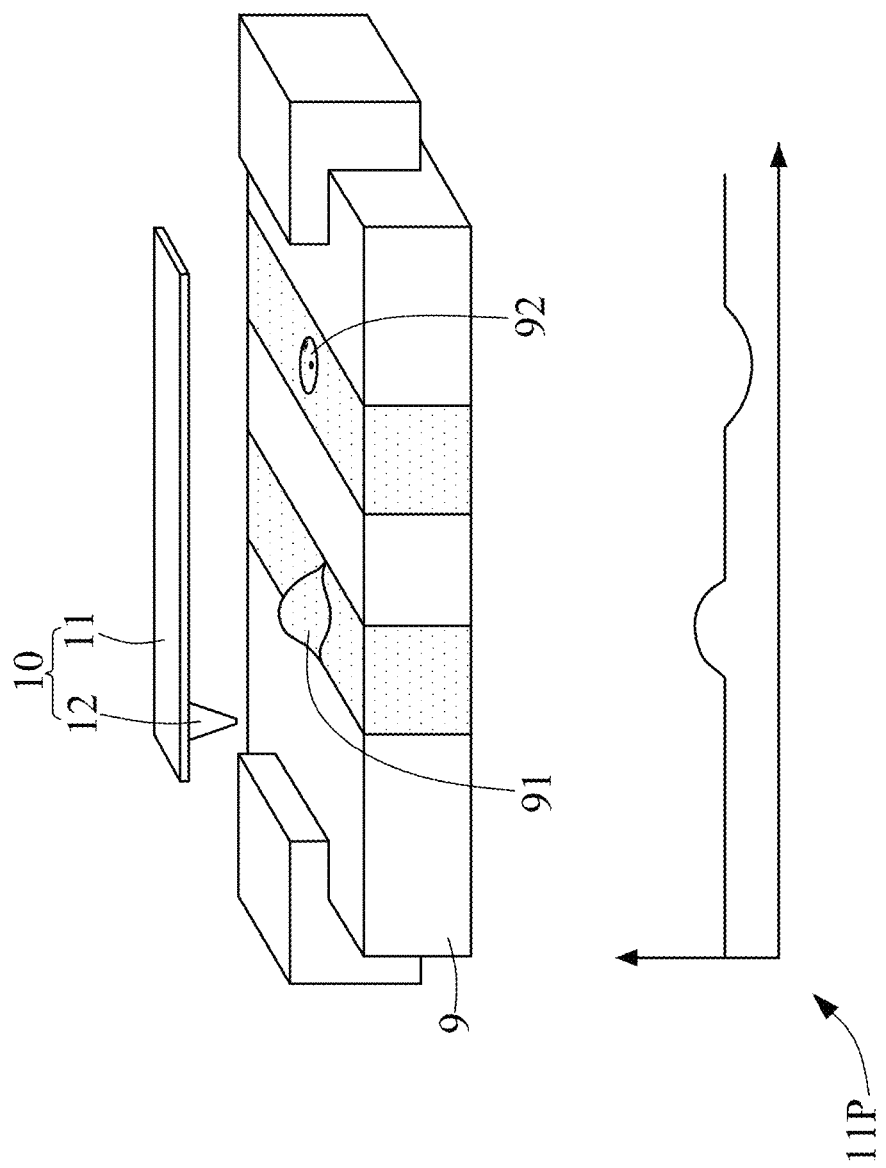
FIG. 1A is a schematic view of a magnetic force microscope used in a magnetic distribution detection method in accordance with an embodiment of the present invention.

With reference to FIG. 1A for a magnetic force microscope used in an embodiment of the present invention, the magnetic force microscope 10 includes a cantilever 11 and a probe 12, and the probe 12 is magnetic and installed at the front of the cantilever 11. The magnetic force microscope 10 uses the magnetic force between the probe 12 and a magnetic material (which is the sample 9) to measure the magnetic distribution of the sample 9 and then uses a computer system (not shown in the figure) to create an image of the magnetic distribution.

In a conventional detection, the probe 12 measures the sample 9 from a closer distance at first. The magnetic force microscope 10 generally needs to scan the sample 9 twice. In the first scan, the probe 12 measures the sample 9 from a closer distance (0~50 nm) by a tapping mode, so that the influence to the cantilever 11 caused by the van der Waals force of the sample 9 is much greater than by the magnetic force, and thus the action of the cantilever 11 mainly reflects the appearance of the surface of the sample 9. For example, the surface of the sample 9 has a bump 91 and a groove 92, and thus the linear graph 11P showing the action of the cantilever 11 also reflects the appearance and shape of the bump 91 and the groove 92.

In order to reduce the influence caused by the van der Waals force, the probe 12 needs to keep a certain distance from the sample 9 to measure the magnetic signal of the sample 9 under the influence of the van der Waals force. Specifically, it is necessary to lift the probe 12 to a position with a distance D (such as 50~250 nm) from the surface of the sample 9, and then carry out the second scan along the moving path of the first scan (please refer to FIG. 1B for a probe 12 measuring the sample 9 at a higher position). In this way, the force exertion conditions of the probe 12 obtained in the first scan and the second scan are taken into consideration to determine the magnetic distribution of sample 9. However, in the second scan, the probe 12 measures the sample 9 from a higher position, so that the received magnetic signal is weak and divergent, and the detection accuracy and the spatial resolution are poor.

In addition, if it is necessary to know the magnetism of each magnetic domain on the surface of the sample 9, the conventional test needs to reverse the original magnetic direction of the probe 12 (for example, the original north pole facing the sample is changed to the south pole facing the sample) and measure the same magnetic domain again in order to know the magnetism of each magnetic domain. However, it takes a lot of time for the reversal of the magnetism of the probe 12, leading to reduce the detection efficiency.

Figure 2A:
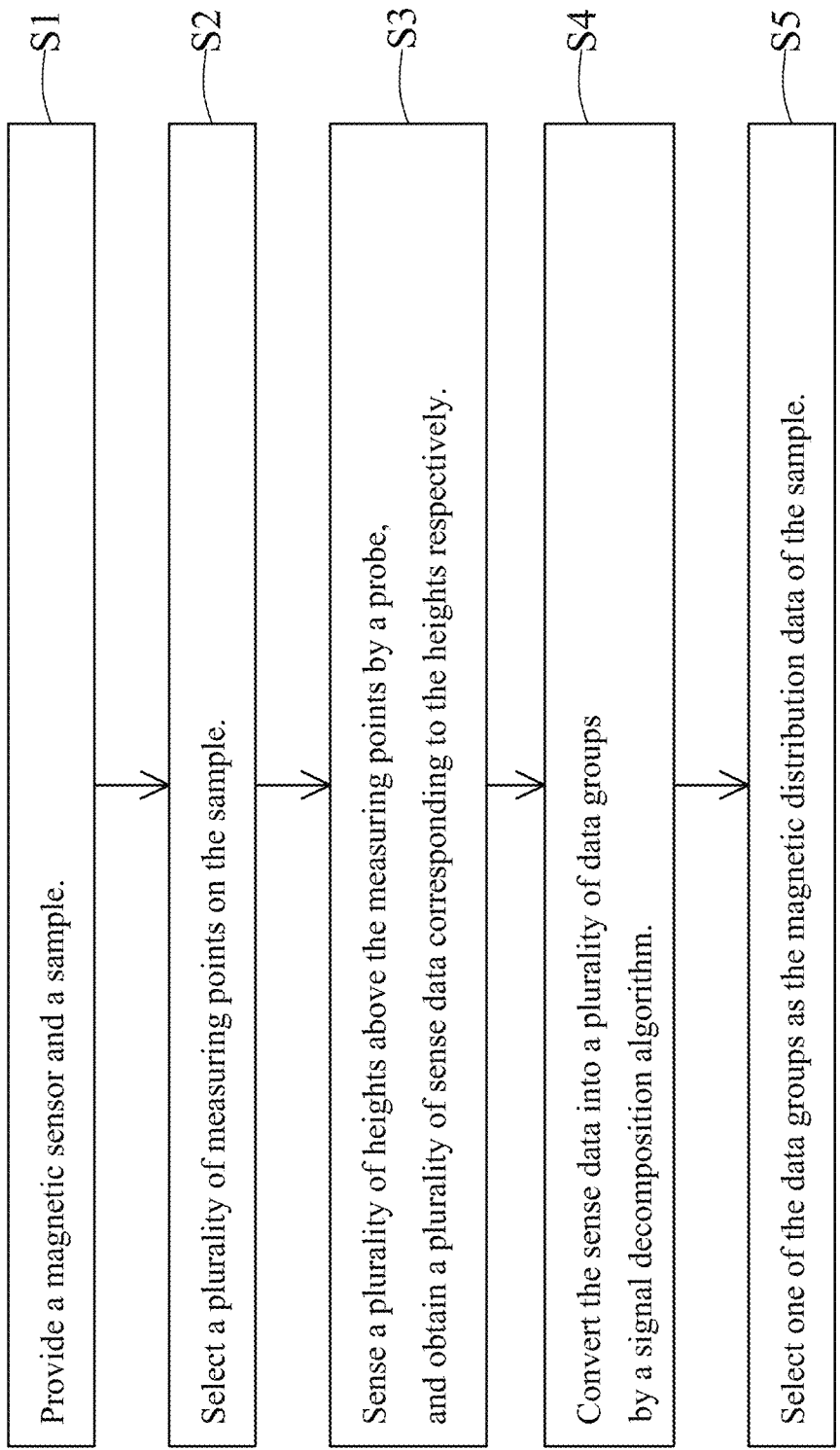
FIG. 2A is a flow chart of a magnetic distribution detection method of the present invention.
Figure 3A:
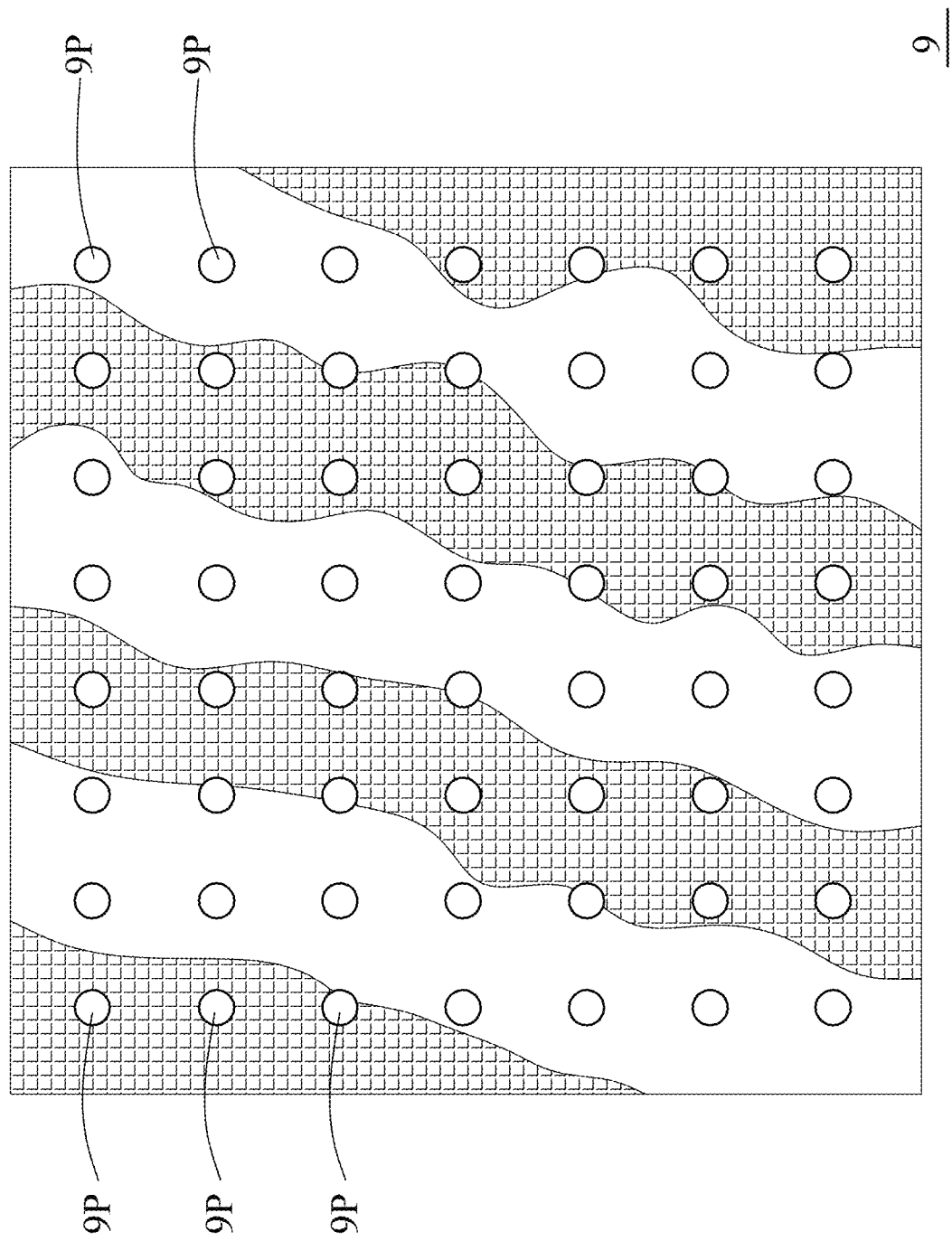
FIG. 3A is a top view of a sample.

With reference to FIG. 2A for the flow chart of a magnetic distribution detection method in accordance with one of the embodiments of the present invention and FIG. 3A for the top view of the sample 9, the magnetic distribution detection method comprises the following steps:

Step S1: Provide a magnetic sensor and a sample 9. In this embodiment, the sample 9 is a magnetic tape; in other words, the magnetic area on the surface of the sample 9 shows a tape-shaped distribution. It is noteworthy that the magnetic area distribution on the sample 9 as depicted in FIG. 3A is illustrative only, but it does not represent the real situation. The magnetic sensor is the magnetic force microscope 10 as shown in FIG. 1A, and the material of the sample 9 is a ferromagnetic material with strong magnetism which is conducive to the observation of the magnetic distribution of the sample. In other embodiments, the magnetic sensor can also be a Scanning NV Magnetometry, a Scanning SQUID Microscope, or a Scanning Hall Probe Microscope (SHPM).

Step S2: Select a plurality of measuring points 9P on the sample 9, and the so-called measuring point 9P refers to a measuring point of the sample 9 in the magnetic force microscope 10, and the measuring points 9P is such as arranged in a matrix form. In FIG. 3A, only 64 measuring point 9P are shown, but more measuring points 9P, such as those arranged in a 128*128 matrix including 16384 measuring points are generally used. People having ordinary skill in the art should understand that the more the measuring points, the higher the resolution of the image of the magnetic distribution.

Figure 3B:
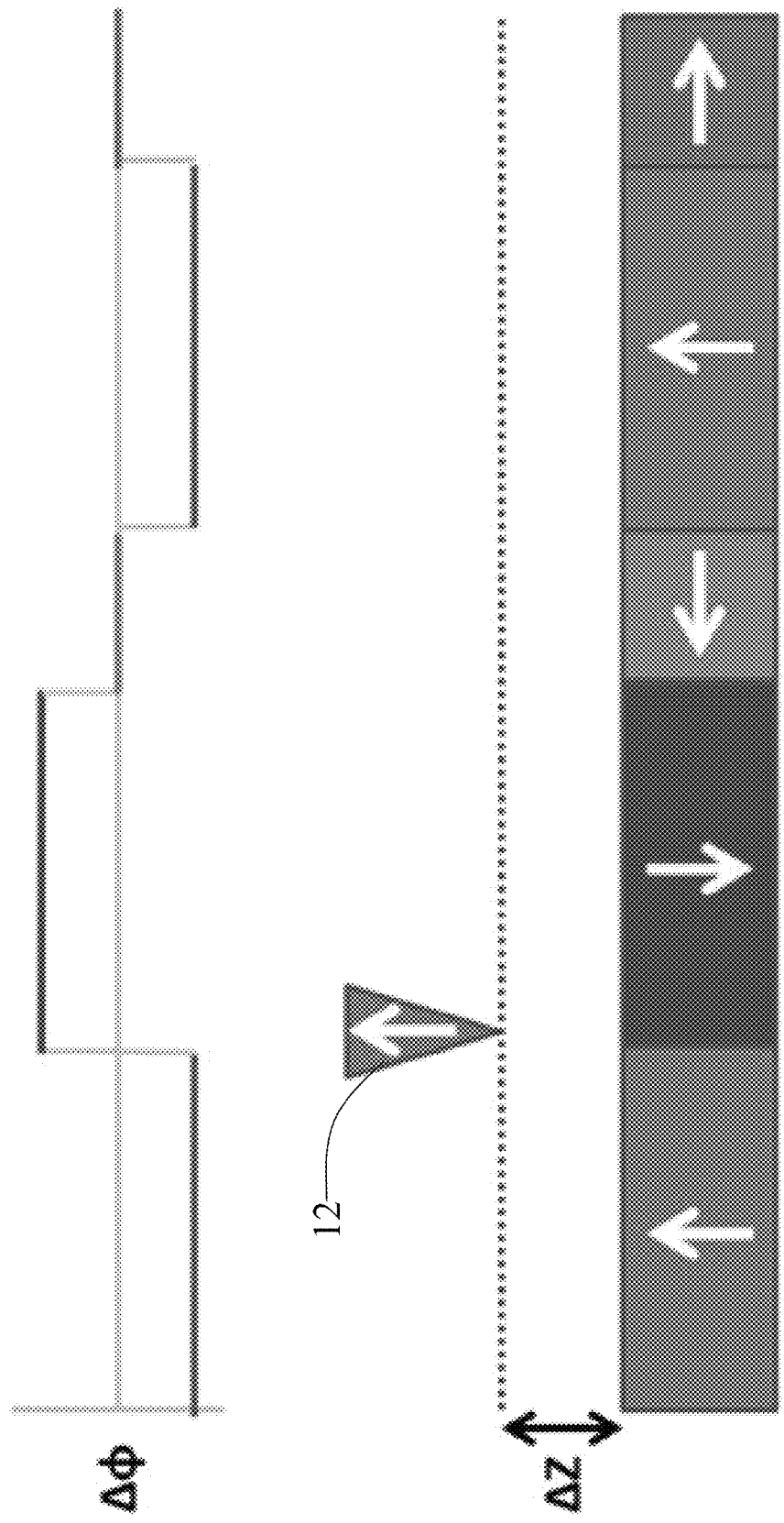
FIG. 3B is a schematic view of the phase difference $\Delta\varnothing$ and the height $\Delta Z$ when the distance of the magnetic probe from a surface of a sample 9 is the height $\Delta Z$.

With reference to FIGS. 2A and 3B, FIG. 3B is the schematic view of the phase difference ΔØ and the height ΔZ when the distance of the magnetic probe from a surface of a sample 9 is the height ΔZ.

Step S3: Use a probe 12 of a magnetic force microscope 10 to obtain a plurality of sense data corresponding to a series of heights above the measuring points 9P respectively. In other words, the probe 12 of the magnetic force microscope 10 senses a plurality of heights above the measuring points 9P respectively and obtains the sense data (phase difference ΔØ) corresponding to the heights respectively. Please refer to FIG. 3A for details. When the sample 9 is measured, the probe 12 can stay at a position of a different height (within a range of 0~250 nm) above each measuring point 9P for the sensing in order to obtain the phase difference ΔØ corresponding to the different height. For example, the range of the height from 0 nm to 250 nm can be divided into 256 points. In other words, the range of the height from 0 nm to 250 nm is divided into 256 equal parts, and the probe 12 is placed at each different height to measure the sample 9 and record the measurements. In this embodiment, the sample 9 is made of a ferromagnetic material having a plurality of magnetic domains. Since each magnetic domain has a different magnetic effect on the probe 12, the magnetic force microscope 10 can be used to obtain the relative magnetic properties of the magnetic domain.

In this embodiment, the sense data are represented by the phase difference ΔØ. The relationship between the phase difference ΔØ and the action force along the Z-axis of the probe 12 is shown below:

$$\Delta\phi \approx \frac{2Q\Delta\omega}{\omega_0} = -\frac{Q}{k}F'_z$$

In the above equation, Q is the quality factor, and k is the spring constant. Measuring the phase difference ΔØ is equivalent to measuring the exerted magnetic force. In the following embodiment, the phase difference ΔØ of each point on the same plane of the sample 9 is expressed by brightness and contrast and used to express the magnetic distribution of the surface of the sample 9. However, the phase difference ΔØ of each point on the sample 9 can also be expressed by a 3D drawing. In other words, the Z-axis represents the phase difference ΔØ, the XY plane represents the surface of the sample 9. In addition, the force exertion of the probe 12 can also be represented by frequency or amplitude. In the following embodiments, all sense data are represented by the phase difference ΔØ.

In this embodiment, the range of the height above the measuring point 9P of the probe 12 of the magnetic force microscope 10 is set to 0~50 nm. Since the magnetic force is inversely proportional to the square of distance, therefore the magnetic force microscope 10 is closer to the sample 9 within this range, and the phase difference $\Delta\varnothing$ can be measured more precisely. Of course, the distance between the probe 12 of the magnetic force microscope 10 and the sample 9 can have another height range such as 50~250 nm.

Step S4: Use a signal decomposition algorithm to convert the sense data (or phase difference $\Delta\varnothing$) into a plurality of data groups. Specifically, the signal decomposition algorithm used in this embodiment is a principal component analysis algorithm (PCA) which is a data dimension reduction analysis technique. In other words, the principal component analysis algorithm will convert all sense data into a plurality of data groups which are independent to one another in vector space.

Figure 4C:
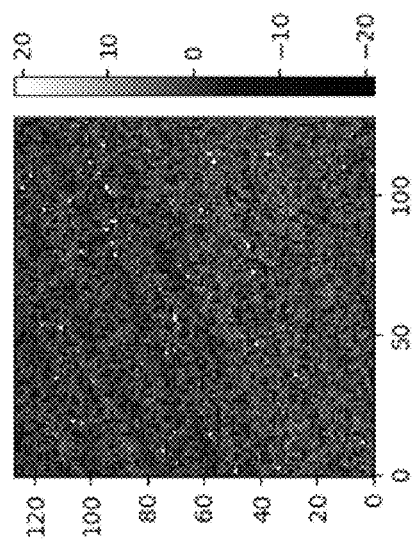
FIGS. 4A to 4C are pictures showing the force exertion distribution of the first to third data groups analyzed by principal component analysis respectively.
Figure 4B:
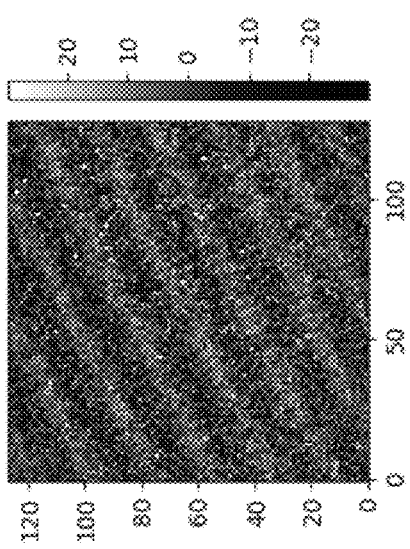
Figure 4A:
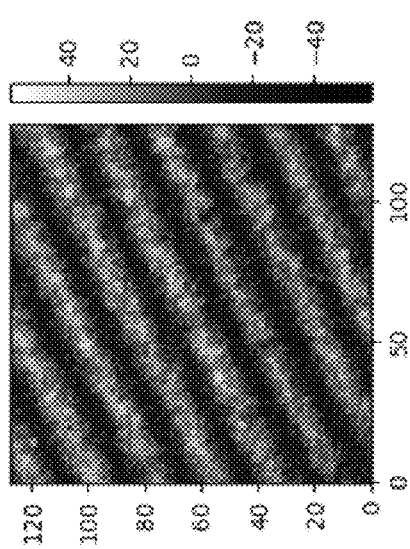

With reference to FIGS. 4A to 4C for the pictures showing the force exertion distribution of the first to third data groups analyzed by principal component analysis respectively, the principal component analysis used in this embodiment converts all sense data into multiple data groups. In the embodiments, the number of data groups is equal to the number of height divisions (e.g. 256 points). By a computer system three diagrams of the force exertion distribution are formed according to the first to third data groups (the force exertion distribution of other groups are not shown in the embodiment). In the principal component analysis, the smaller the labelled number the principal component, the larger the representativeness to the sense data. For example, the first group of principal components has a percentage of impact higher than that of the second groups of principal components, and the second group of principal components has a percentage of impact higher than that of the third group of principal components. In other embodiments, other types of signal decomposition algorithm can also convert the sense data into the plurality of data groups, in which there is one of the groups that represents the influence caused by the magnetic force.

In the above embodiment, the principal component analysis algorithm is used as the signal decomposition algorithm. However, other types of signal decomposition algorithm, such as non-negative matrix factorization, independent components analysis, or factor analysis can also be used in other embodiments of the present invention. The reason why the principal component analysis algorithm or other signal decomposition algorithms can be used to convert the measured signal into different components resides on the sense data of at a series of heights above the measuring points 9P as described in the Step S3. Since the change of van der Waals force varying with the height and the change of the magnetic force varying with the height are different, therefore the principal component analysis can convert the van der Waals force and the magnetic force in the sense data into different data groups.

Step S5: Select one of the data groups as the magnetic distribution data of the sample. In detail, the sample 9 of this embodiment is a magnetic tape made of a ferromagnetic material. Since the sample 9 is a magnetic tape, the magnetic distribution will be in the shape of a tape, and the first group of principal components as shown in FIG. 4A are able to be determined as being contributed by magnetism. Since the magnetic distribution of the magnetic tape can be expected to be in the shape of a tape, therefore in the Step S5 a computer with function or algorithm for pattern recognition is used for determination in some embodiment. With reference to FIGS. 4B and 4C for the images of the second groups of principal components and the third groups of principal components respectively, FIGS. 4B and 4C show the surface undulation and the left half side of the particles on the surface, respectively.

Figure 1B:
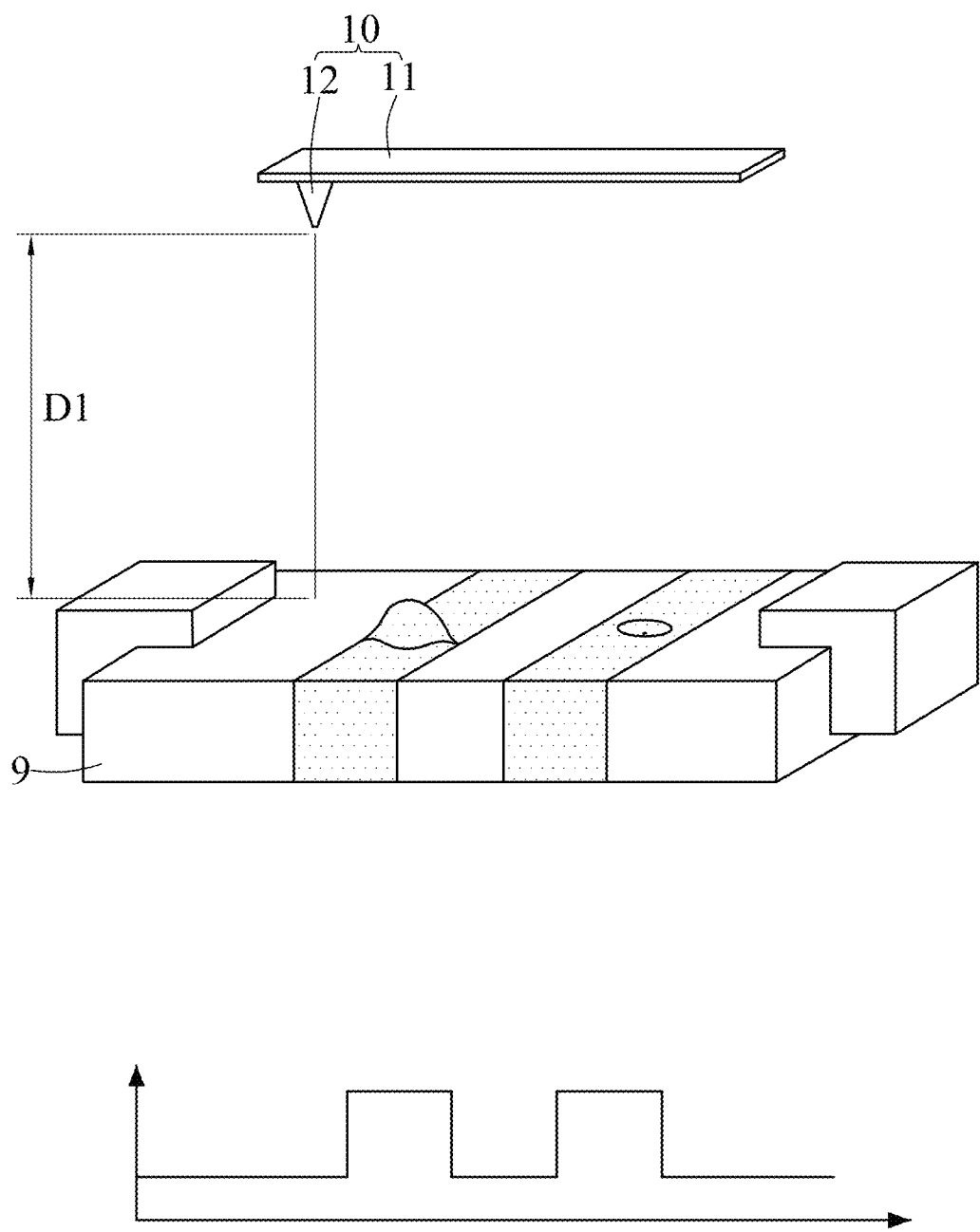
FIG. 1B is a schematic view of a probe measuring a sample at a higher position.

From the description above, even though the probe 12 of the magnetic force microscope 10 is closer to the surface of the sample 9 and the detection result is affected by the van der Waals force more easily, one of the groups (which is the first group of principal components of this embodiment) can be used as the magnetic distribution and the magnetic distribution chart can be drawn without requiring the two scans of the traditional measuring method (as shown in FIG. 1B) after the principal component analysis, and thus the present invention has a higher detection efficiency. Compared with the prior art, the probe 12 of the magnetic force microscope 10 of this embodiment is closer to the surface of the sample 9 (wherein the range of the measuring height is 0~50 nm), so that a larger magnetic force can be sensed to get a more accurate magnetic distribution image.

Figure 5A:
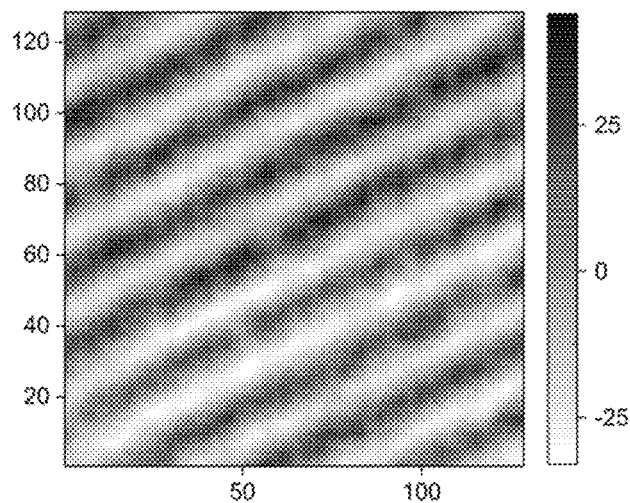
FIGS. 5A and 5B are pictures showing the magnetic distribution when the range of the heights above measuring points is set to 50~250 nm for a magnetic force microscope.
Figure 5B:
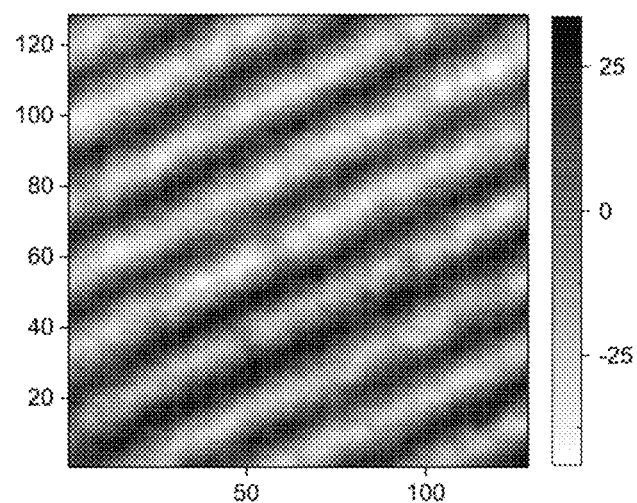

With reference to FIGS. 5A and 5B for the pictures showing the magnetic distribution when the range of the heights above measuring points is set to 50~250 nm for a magnetic force microscope respectively, the magnetism of the probe 12 used in the embodiment as shown in FIG. 5A is N, and the magnetism of the probe 12 used in the embodiment as shown in FIG. 5B is S. In the embodiment as shown in FIGS. 5A and 5B, the measured sense data are processed by the principal component analysis and found that the magnetic distribution of the first group of principal components falls within a height range of 50~250 nm, and the influence caused by the van der Waals force of the sample 9 on the probe 12 is smaller than the magnetic force of the sample 9. It is known from FIGS. 5A and 5B that the magnetic distribution of the sample can be obtained by the detection method of the present invention, regardless of the magnetism (N or S) of the probe 12.

Figure 6:
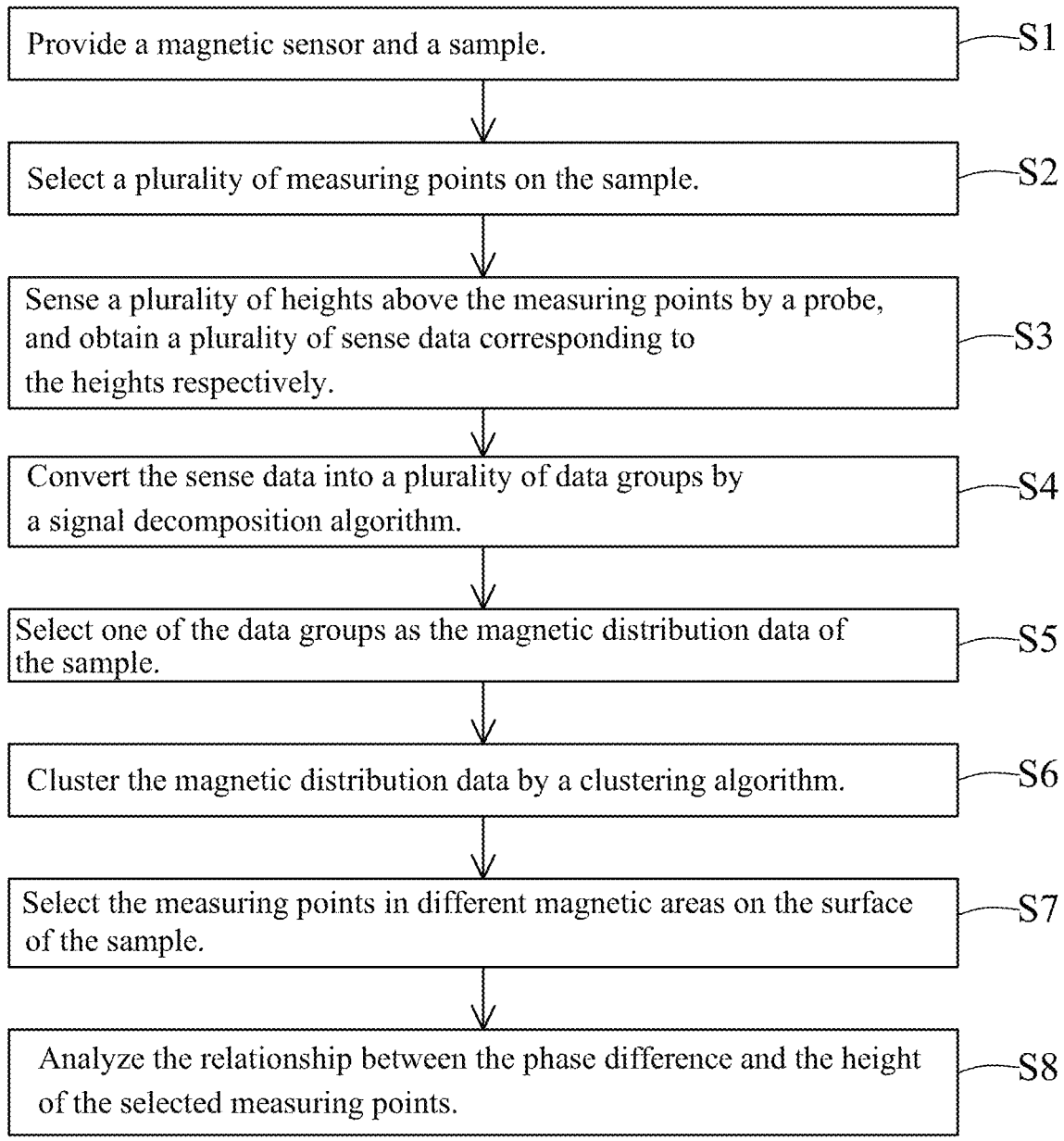
FIG. 6 is a flow chart of a magnetic distribution detection method in accordance with another embodiment of the present invention.

With reference to FIG. 6 for the flow chart of a magnetic distribution detection method in accordance with another embodiment of the present invention, this embodiment further adds the following steps S6~S8 to the embodiment as shown in FIG. 2A. The steps S6~S8 are elaborated as follows.

Figure 7:
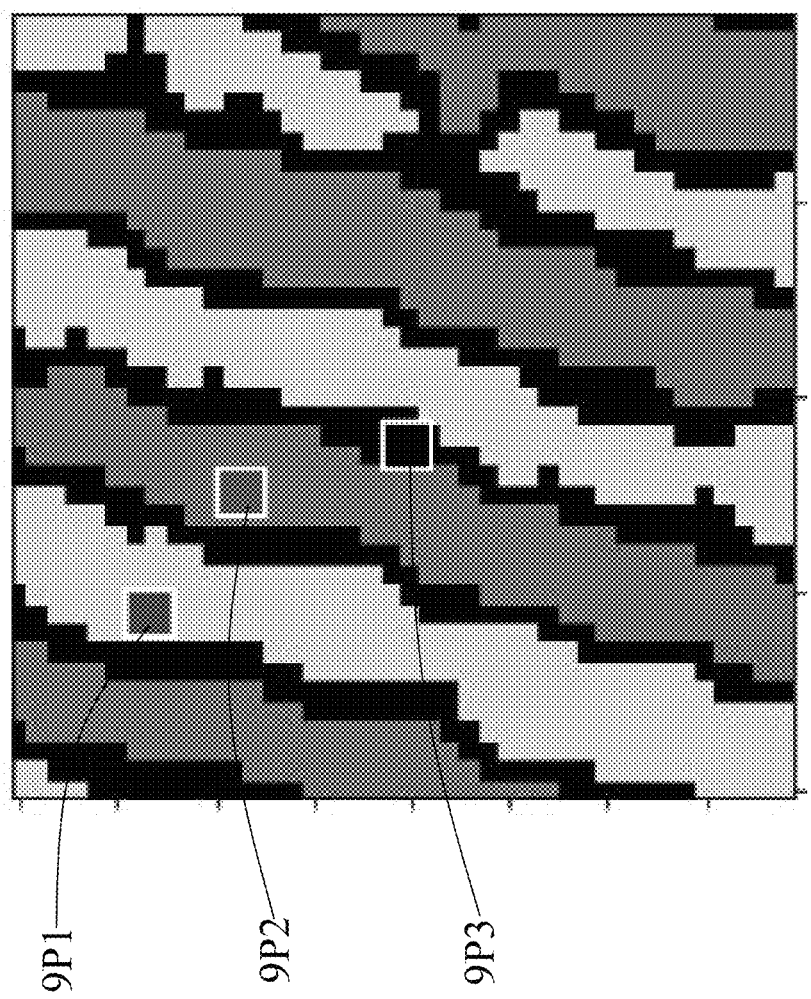
FIG. 7 is a picture showing a pattern obtained after clustering computing.

Step S6: Cluster the magnetic distribution data by a clustering algorithm. In other words, after one of the data groups is selected as the magnetic distribution data of the sample after the principal component analysis in Step S5, the magnetic distribution data are clustered. In the embodiment, the clustering algorithm is a k-means clustering algorithm, which is one of the unsupervised machine learning methods, and this method can divide data into several types. Based on this principle, the k-means clustering algorithm can cluster the sense data of the magnetic distribution to generate a magnetic distribution image as shown in FIG. 7. In this way, it will be conducive to further update and divide the magnetic distribution data more clearly in the future, so as to know the absolute magnetism direction of each magnetic domain on the sample, which is more convenient for some of the subsequent operations.

Step S7: Select a plurality of measuring points 9P of different magnetic areas on the surface of the sample 9 as shown in FIGS. 6 and 7. In this embodiment, the measuring points 9P1, 9P2 and 9P3 as shown in FIG. 7 are selected. In FIG. 7, the measuring points 9P1, 9P2, and 9P3 are disposed in different magnetic areas respectively.

Figure 8:
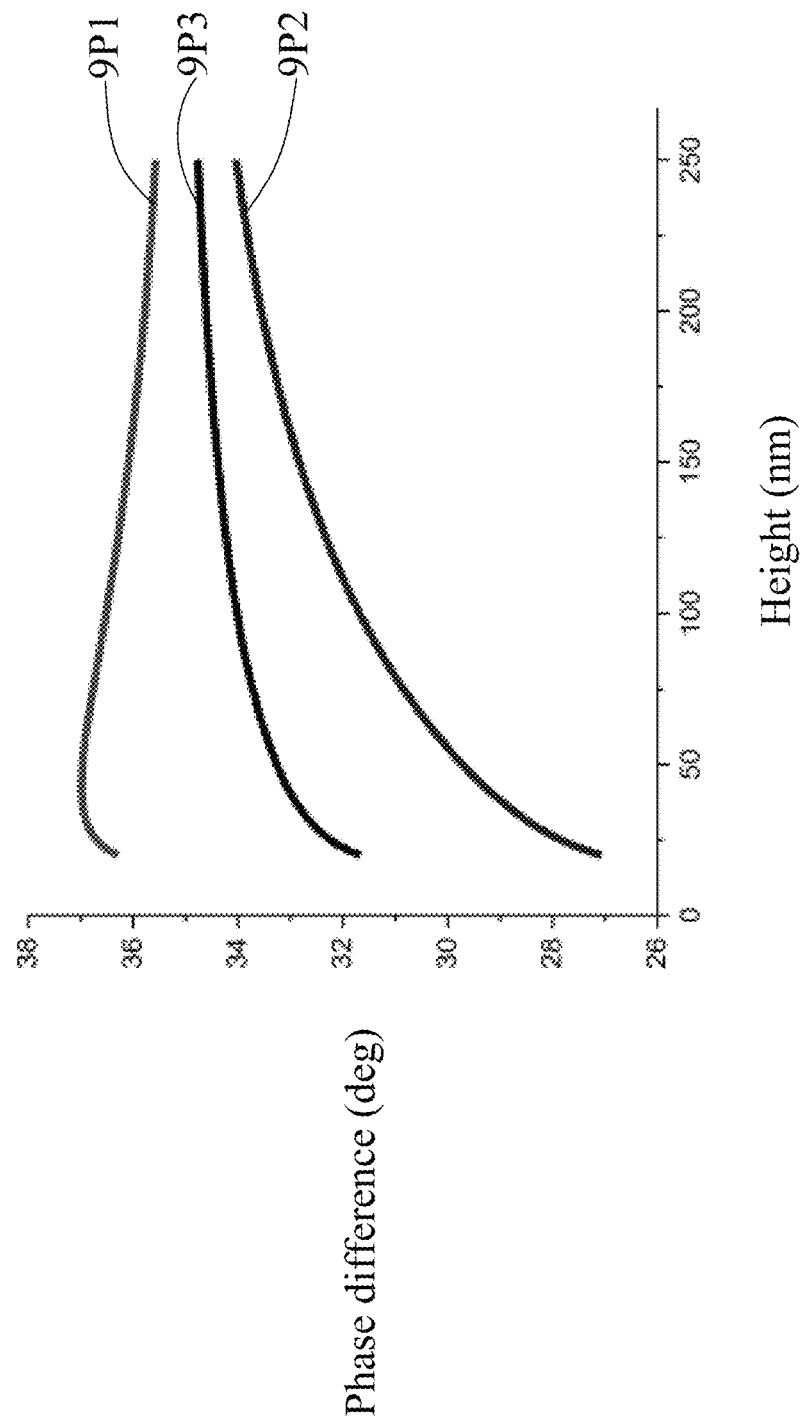
FIG. 8 is a graph showing the relationship between phase difference $\Delta\varnothing$ and height.

Step S8: Analyze the relationship between the phase difference $\Delta\varnothing$ and height of the selected measuring points 9P1~9P3. It is noteworthy that the phase difference ΔØ as described in the Step S8 refers to the data obtained by the principal component analysis as described in the Step S5, which are the corresponding magnetic distribution data (excluding the corresponding data of the van der Waals force). In this embodiment, the relationship between the phase difference ΔØ and height of the measuring points 9P1~9P3 is represented by FIG. 8. In FIG. 8, the relationship between the measured phase difference ΔØ and height of the measuring point 9P1 is that the phase difference ΔØ will increase with the decrease of the height; the relationship between the measured phase difference ΔØ and height of the measuring point 9P2 is that the phase difference ΔØ will decrease with the decrease of the height; and the relationship between the measured phase difference ΔØ and height of the measuring point 9P3 is that the phase difference ΔØ basically will decrease with the decrease of the height, but the decrease of the phase difference ΔØ is smaller than that of the measuring point 9P2. Theoretically, if the magnetism of the probe 12 and the magnetism of the surface of the sample 9 are the same (in other words, a repulsion exists between them), the phase difference will increase with the decrease of the height. On the contrary, if the magnetism of the probe 12 and the magnetism of the surface of the sample 9 are different (in other words, an attraction exists between them), the phase difference will decrease with the decrease of the height. Therefore, if the magnetism of the probe 12 is north pole, the magnetism of the area where the measuring point 9P1 is disposed will be north pole, and the magnetism of the area where the measuring point 9P2 is situated will be south pole, and the magnetism of the area where the measuring point 9P3 is situated can be regarded as a transitional area.

By the method as described in the Steps S7 and S8, the magnetism of different magnetic areas on the surface of the sample 9 can be determined without requiring the magnetic reversal of the probe 12. It is noteworthy that even without carrying out the Step S6, the Steps S7 and S8 can determine the magnetism of different magnetic areas on the surface of the sample 9. In other words, the main purpose of the clustering algorithm is to facilitate observer to clearly distinguish different magnetic areas on the sample, but it is not a necessary condition for the execution of the Steps S7 and S8.

Figure 9B:
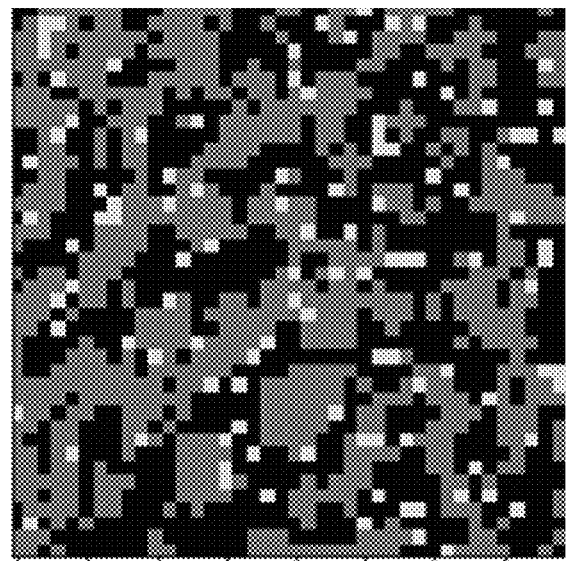
FIGS. 9A and 9B are pictures showing the magnetic distribution of a weak magnetic sample.
Figure 9A:
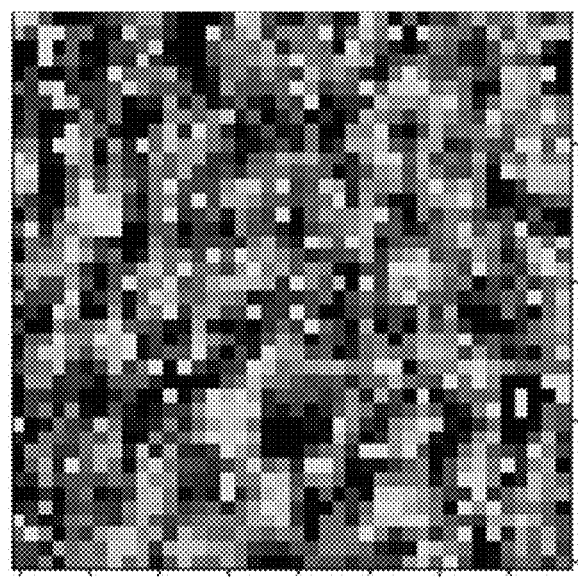

With reference to FIGS. 9A and 9B for the magnetic distribution of a weak magnetic sample, the weak magnetic sample of this embodiment is made of a cobalt ferrite film with ferromagnetism, and the magnetic force microscope 10 is used to measure the height of the measuring point (within the range of 50~250 nm) of the weak magnetic sample and obtain the magnetic distribution of the sample after the principal component analysis. In FIG. 9A, the sense data measured by the magnetic force microscope 10 are analyzed by the principal component analysis, the first group of principal components shows a magnetic force distribution. In the prior art, the measurement of a weak magnetic sample will be interfered by the van der Waals force more easily, and it is not easy to obtain an accurate magnetic distribution. However, the detection method of the present invention can still obtain the magnetic distribution of a weak magnetic sample accurately.

After the k-means clustering algorithm is used to process the data group of the first group of principal components, the magnetic distribution will be as shown in FIG. 9B. By comparing FIG. 9A with FIG. 9B, we can see that the observer can observe the absolute magnetic direction of each magnetic domain on the sample clearly after the processing by the k-means clustering algorithm.

In the embodiment above, the k-means clustering algorithm is an embodiment of the clustering algorithm. In other embodiments, the clustering algorithm can also be an agglomerative clustering algorithm, a spectral clustering algorithm, or a mean shift clustering algorithm.

In summation of the description above, the magnetic distribution detection method of the present invention has the following advantages:

(1) By using the principal component analysis or other types of signal decomposition algorithms, this invention can eliminate the influence caused by the van der Waals forces without requiring two scans as required in the conventional method, thereby improving the detection efficiency.

(2) There is no need to change the magnetic poles of the probe in order to confirm the magnetic property (i.e. North Pole or South Pole) of each magnetic domain on the surface of the sample.

(3) By using the k-means clustering algorithm or other clustering algorithms, the observer can observe the absolute magnetic direction of each magnetic domain on the sample clearly.

Although the invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A magnetic distribution detection method, for detecting the magnetic distribution of a sample, and the method comprising the steps of:
   (a) providing a magnetic sensor, and precisely aligning a probe of the magnetic sensor with the sample;
   (b) selecting a plurality of measuring points on the sample;
   (c) sensing the measuring points by the magnetic sensor, and obtaining a plurality of sense data;
   (d) converting the sense data into a plurality of data groups by a signal decomposition algorithm; and
   (e) selecting one of the data groups as the magnetic distribution data of the sample;
   wherein in the step (c), a plurality of heights from the measuring points are sensed, and the sense datum corresponding to each height is obtained.

2. The magnetic distribution detection method according to claim 1, wherein the magnetic sensor is a magnetic force microscope.

3. The magnetic distribution detection method according to claim 1, wherein the signal decomposition algorithm is a principal component analysis algorithm.

4. The magnetic distribution detection method according to claim 1, after the step (e) the method further comprising the steps of:
   (f) selecting a measuring point in a different magnetic area on the surface of the sample; and
   (g) analyzing the relationship between the heights above the selected measuring point and the data obtained in the step (e).

5. The magnetic distribution detection method according to claim 4, further comprising the step of clustering the magnetic distribution sense data by a clustering algorithm, which is carried out between the step (e) and the step (f).

6. The magnetic distribution detection method according to claim 5, wherein the clustering algorithm is a k-means clustering algorithm.

7. The magnetic distribution detection method according to claim 1, wherein the height has a range of 0~50 nm or 50~250 nm.

8. The magnetic distribution detection method according to claim 1, further comprising the step of clustering the magnetic distribution sense data by a clustering algorithm, which is carried out after the step (e).

9. The magnetic distribution detection method according to claim 8, wherein the clustering algorithm is a k-means clustering algorithm.

10. The magnetic distribution detection method according to claim 1, wherein the sense data are represented by a phase difference.

11. The magnetic distribution detection method according to claim 2, wherein the signal decomposition algorithm is a principal component analysis algorithm.

12. The magnetic distribution detection method according to claim 2, after the step (e) the method further comprising the steps of:
(f) selecting a measuring point in a different magnetic area on the surface of the sample; and
(g) analyzing the relationship between the heights above the selected measuring point and the data obtained in the step (e).

13. The magnetic distribution detection method according to claim 12, further comprising the step of clustering the magnetic distribution sense data by a clustering algorithm, which is carried out between the step (e) and the step (f).

14. The magnetic distribution detection method according to claim 13, wherein the clustering algorithm is a k-means clustering algorithm.

15. The magnetic distribution detection method according to claim 2, wherein the height has a range of 0~50 nm or 50~250 nm.

16. The magnetic distribution detection method according to claim 2, further comprising the step of clustering the magnetic distribution sense data by a clustering algorithm, which is carried out after the step (e).

17. The magnetic distribution detection method according to claim 16, wherein the clustering algorithm is a k-means clustering algorithm.

18. The magnetic distribution detection method according to claim 2, wherein the sense data are represented by a phase difference.

* * * * *